US010867628B2

(12) United States Patent
Ee et al.

(10) Patent No.: US 10,867,628 B2
(45) Date of Patent: Dec. 15, 2020

(54) MULTI-LAYER MICROACTUATORS FOR HARD DISK DRIVE SUSPENSIONS

(71) Applicant: Magnecomp Corporation, Murrieta, CA (US)

(72) Inventors: Kuen Chee Ee, Chino, CA (US); Long Zhang, Murrieta, CA (US); Peter Hahn, Bangkok (TH); David Glaess, Bangkok (TH); Amornrat Jaturawit, Bangkok (TH)

(73) Assignee: Magnecomp Corporation, Murrieta, CA (US)

( * ) Notice: Subject to any disclaimer, the term of this patent is extended or adjusted under 35 U.S.C. 154(b) by 0 days.

(21) Appl. No.: 16/930,768

(22) Filed: Jul. 16, 2020

(65) Prior Publication Data

US 2020/0349970 A1 Nov. 5, 2020

Related U.S. Application Data

(62) Division of application No. 16/254,240, filed on Jan. 22, 2019, now Pat. No. 10,748,564.
(Continued)

(51) Int. Cl.
*G11B 5/48* (2006.01)
*H01L 41/047* (2006.01)
*H01L 41/09* (2006.01)

(52) U.S. Cl.
CPC ............ *G11B 5/4833* (2013.01); *G11B 5/484* (2013.01); *G11B 5/4873* (2013.01);
(Continued)

(58) Field of Classification Search
CPC ..... G11B 5/4833; G11B 5/4873; G11B 5/484; G11B 21/16; G11B 21/20; H01L 41/0471;
(Continued)

(56) References Cited

U.S. PATENT DOCUMENTS 4,443,729 A 4/1984 Rider
6,501,625 B1 12/2002 Boismier et al.
(Continued)

FOREIGN PATENT DOCUMENTS

WO WO 00/063978 A3 10/2000

OTHER PUBLICATIONS

Office Action in U.S. Appl. No. 16/254,240, dated Dec. 5, 2019.
(Continued)

*Primary Examiner* — Brian E Miller
(74) *Attorney, Agent, or Firm* — DLA Piper LLP (US)

(57) ABSTRACT

A multi-layer microactuator for a hard disk drive suspension includes a piezoelectric ("PZT") layer, a constraining layer, a lower electrode layer, a middle electrode layer, and an upper electrode layer. The lower electrode layer is on a bottom surface of the PZT layer and includes a first lower electrode island, a second lower electrode island, and a third lower electrode island. The second lower electrode island includes a finger extending from a main body portion towards a first end of the PZT layer. The middle electrode layer is disposed between a top surface of the PZT layer and a bottom surface of the constraining layer. The middle electrode layer including a first middle electrode island and a second middle electrode island, the second middle electrode island including a finger extending from a main body portion towards the first end of the PZT layer.

15 Claims, 8 Drawing Sheets

Related U.S. Application Data

(60) Provisional application No. 62/621,990, filed on Jan. 25, 2018.

(52) U.S. Cl.
CPC ...... H01L 41/0471 (2013.01); H01L 41/0472 (2013.01); H01L 41/0933 (2013.01)

(58) Field of Classification Search
CPC ............. H01L 41/0933; H01L 41/0472; H01L 41/0474; H01L 41/0986
See application file for complete search history.

(56) References Cited

U.S. PATENT DOCUMENTS

| | | | |
|---|---|---|---|
| 6,614,144 B2 | 9/2003 | Vazquez Carazo | |
| 6,716,363 B1 | 4/2004 | Wright et al. | |
| 7,459,835 B1 | 12/2008 | Mei et al. | |
| 7,872,834 B1 | 1/2011 | Pokornowski et al. | |
| 9,117,468 B1 * | 8/2015 | Zhang | H02N 2/02 |
| 9,318,136 B1 | 4/2016 | Bjorstrom et al. | |
| 9,330,694 B1 * | 5/2016 | Hahn | G11B 5/4873 |
| 9,330,696 B1 | 5/2016 | Hahn et al. | |
| 9,330,698 B1 | 5/2016 | Hahn et al. | |
| 9,741,376 B1 | 8/2017 | Ee et al. | |
| 10,074,390 B1 | 9/2018 | Hahn et al. | |
| 10,236,022 B2 * | 3/2019 | Ee | G11B 5/483 |
| 10,679,652 B2 * | 6/2020 | Ee | G11B 5/483 |
| 10,748,564 B2 | 8/2020 | Ee et al. | |
| 2001/0050833 A1 | 12/2001 | Murphy et al. | |
| 2002/0019064 A1 | 2/2002 | Hara | |
| 2002/0063496 A1 | 5/2002 | Forck et al. | |
| 2007/0007863 A1 | 1/2007 | Mohr, III | |
| 2008/0079333 A1 | 4/2008 | Ulm et al. | |
| 2009/0080116 A1 | 3/2009 | Takahashi et al. | |
| 2009/0195938 A1 | 8/2009 | Yao et al. | |
| 2010/0195251 A1 | 8/2010 | Nojima et al. | |
| 2014/0104722 A1 | 4/2014 | Wright et al. | |
| 2015/0350792 A1 | 12/2015 | Grosh et al. | |

OTHER PUBLICATIONS

Office Action in U.S. Appl. No. 16/254,240, dated Feb. 14, 2020.
Notice of Allowance in U.S. Appl. No. 16/254,240, dated Apr. 16, 2020.

* cited by examiner

MULTI-LAYER MICROACTUATORS FOR HARD DISK DRIVE SUSPENSIONS

CROSS-REFERENCE TO RELATED APPLICATIONS

This application is a Divisional of U.S. patent application Ser. No. 16/254,240, filed Jan. 22, 2019, which claims priority from U.S. Provisional Patent Application No. 62/621,990, filed on Jan. 25, 2018, each of which is hereby incorporated by reference in its entirety.

FIELD OF THE PRESENT DISCLOSURE

The present disclosure relates generally to disk drive suspensions and flexures, and more particularly, to multi-layer microactuation assemblies for suspensions and flexures.

BACKGROUND

Disk drive head suspensions are used in hard disk drives ("HDD's"), which read and write media to and from rotating magnetic disks. A suspension is a component of a head gimbal assembly ("HGA"), which includes a plurality of suspensions and magnetic read/write heads (known as a "sliders"). The slider includes transducers to read and write media to one of the rotating magnetic disks. A disk drive head suspension can include various components, including, for example, a flexure, a load beam, a baseplate, and one or more actuation motors. Generally, the actuation motors can be used to precisely position the slider over a rotating magnetic disk to improve the overall performance of the HDD.

There remains a continued need for improved disk drive head suspensions to meet the demands of the HDD industry. Suspensions with enhanced performance capabilities are desired, while being capable of being manufactured efficiently. The present disclosure addresses these and other problems.

SUMMARY

According to some embodiments, a multi-layer microactuator for a hard disk drive suspension includes a piezoelectric ("PZT") layer, a constraining layer, a lower electrode layer, a middle electrode layer, and an upper electrode layer. The lower electrode layer is on a bottom surface of the PZT layer and includes a first lower electrode island, a second lower electrode island, and a third lower electrode island. The second lower electrode island includes a finger and a main body, the finger extending from the main body towards a first end of the PZT layer. The middle electrode layer is disposed between a top surface of the PZT layer and a bottom surface of the constraining layer and includes a first middle electrode island and a second middle electrode island. The second middle electrode island includes a finger and main body portion, the finger extending from the main body towards the first end of the PZT layer. The upper electrode layer is on a top surface of the constraining layer.

According to other embodiments, a suspension for a hard disk drive includes a load beam, a flexure, and a microactuator. The load beam includes a dimple. The flexure is coupled to the load beam and includes a spring metal layer, an insulating layer, and a conductive layer. The spring metal layer includes a slider mounting region, a first mounting region, and a second mounting region. The slider mounting region has a load point location for engaging the dimple of the load beam. The conductive layer includes a power trace and a ground pad, the motor power trace including a terminal pad. The microactuator includes a piezoelectric ("PZT") layer, a constraining layer, a lower electrode layer, a middle electrode layer, and an upper electrode layer. The lower electrode layer is on a bottom surface of the PZT layer and includes a first lower electrode island, a second lower electrode island, and a third lower electrode island. The first lower electrode island is electrically connected to the terminal pad. The second lower electrode island includes a finger and a main body portion, the finger extending from the main body portion towards a first end of the PZT layer. The third lower electrode island is electrically connected to the ground pad. The middle electrode layer is disposed between a top surface of the PZT layer and a bottom surface of the constraining layer. The middle electrode layer includes a first middle electrode island and a second middle electrode island. The second middle electrode island includes a finger and main body portion, the finger extending from the main body portion towards the first end of the PZT layer. The upper electrode layer is on a top surface of the constraining layer.

According to other embodiments, a multi-layer microactuation assembly for a hard disk drive suspension includes a piezoelectric ("PZT") layer, a constraining layer, a lower electrode layer, a middle electrode layer, an upper electrode layer, a first side end electrode, and a second side end electrode. The lower electrode layer is on a bottom surface of the PZT layer and includes a first lower electrode island and a second lower electrode island. The second lower electrode island includes a main body portion and a finger, the finger extending from the main body portion towards a first end of the multi-layer microactuation assembly. The middle electrode layer is disposed between a top surface of the PZT layer and a bottom surface of the constraining layer. The upper electrode layer is on a top surface of the constraining layer. The first side end electrode is coupled to the upper electrode and extends in a direction substantially orthogonal to the upper electrode towards the lower electrode layer. The second side end electrode is coupled to the first lower electrode island and extends in a direction substantially orthogonal to the first lower electrode island towards the upper electrode layer. The second side end electrode is configured to electrically connect the first lower electrode island and the middle electrode layer.

According to other embodiments, a suspension for a hard disk drive includes a load beam, a flexure, and a microactuator. The load beam includes a dimple. The flexure is coupled to the load beam and includes a spring metal layer, an insulating layer, and a conductive layer. The spring metal layer includes a slider mounting region, a first mounting region, and a second mounting region. The slider mounting region has a load point location for engaging the dimple of the load beam. The conductive layer includes a power trace and a ground pad, the motor power trace including a terminal pad. The microactuator includes a piezoelectric ("PZT") layer, a constraining layer, a lower electrode layer, a middle electrode layer, an upper electrode layer, a first side end electrode, and a second side end electrode. The lower electrode layer is on a bottom surface of the PZT layer and includes a first lower electrode island that is electrically connected to the ground pad and a second lower electrode island that is electrically connected to the terminal pad. The middle electrode layer is disposed between a top surface of the PZT layer and a bottom surface of the constraining layer. The upper electrode layer is on a top surface of the constraining layer. The first side end electrode is coupled to the upper electrode and extends in a direction substantially orthogonal to the upper electrode towards the lower electrode layer. The first side end electrode is electrically connected to the terminal pad via a first volume conductive adhesive. The second side end electrode is coupled to the first lower electrode island and extends in a direction substantially orthogonal to the first lower electrode island towards the upper electrode layer.

The above summary of the present disclosure is not intended to represent each embodiment, or every aspect, of the present disclosure. Additional features and benefits of the present disclosure are apparent from the detailed description and figures set forth below.

Figure 1:
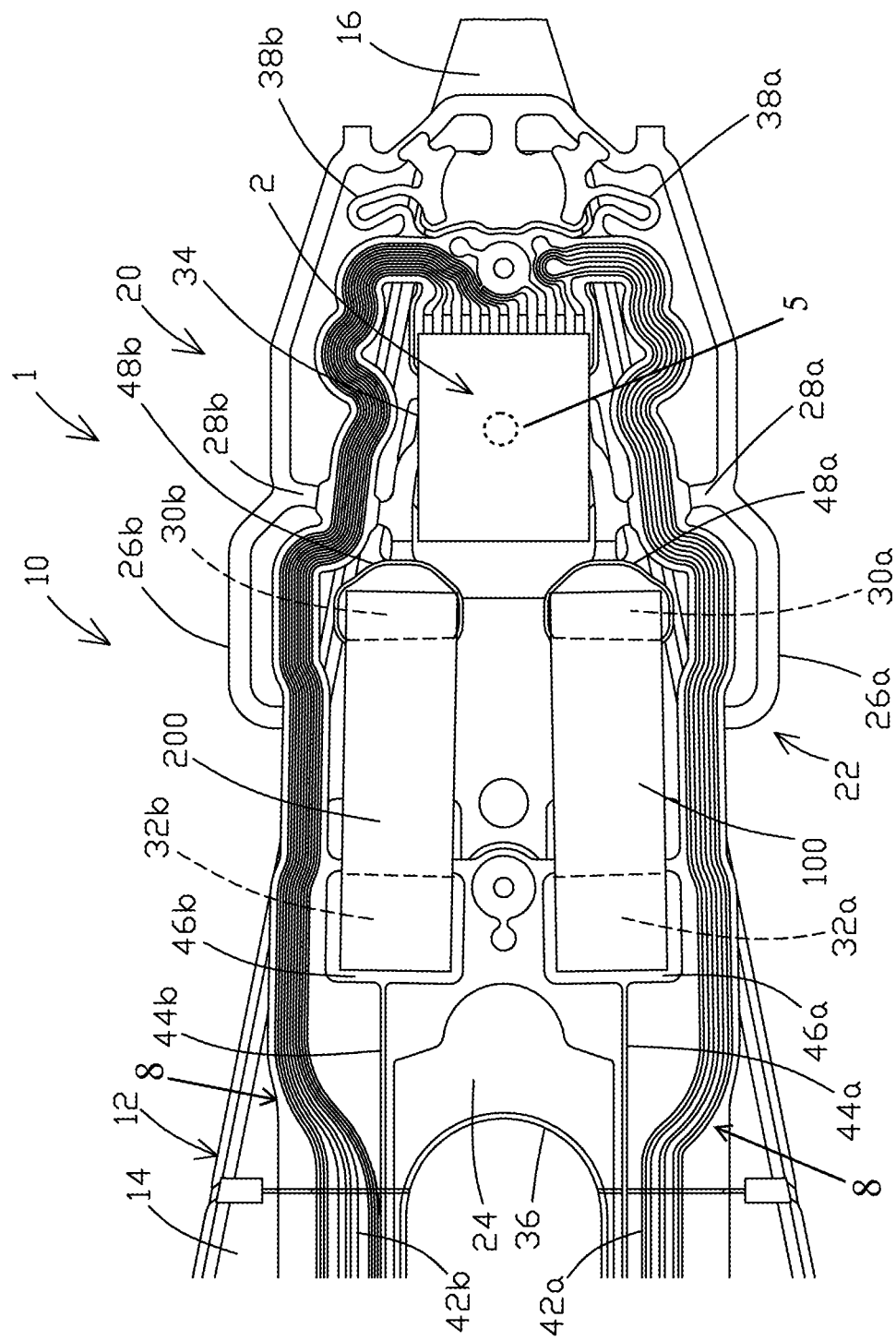
FIG. 1 is a partial plan view of a head gimbal assembly including a suspension and a slider.

While the disclosure is susceptible to various modifications and alternative forms, specific embodiments are shown by way of example in the drawings and are described in detail herein. It should be understood, however, that the disclosure is not intended to be limited to the particular forms disclosed. Rather, the disclosure is to cover all modifications, equivalents and alternatives falling within the spirit and scope of the disclosure.

DETAILED DESCRIPTION

FIG. 1 is a partial plan view of a head gimbal assembly including a suspension and a slider. As illustrated in FIG. 1, a head gimbal assembly ("HGA") 1 includes a slider 2 and a suspension 10. Generally, the HGA 1 is used as a component in a hard disk drive ("HDD"), which is an information storage device that records and/or reproduces data from one or more rotating magnetic disks including a pattern of magnetic ones and zeroes. Generally, when assembled in an HDD, the suspension 10 is coupled to an actuator arm, which in turn is coupled to a voice coil motor that moves the suspension 10 to accurately position the slider 2 over a rotating magnetic disk.

As shown, the suspension 10 includes a load beam 12, a flexure 20, a first microactuator 100, and a second microactuator 200. The load beam 12 is a substantially rigid structure made from one or more metal materials, such as, for example, stainless-steel. The load beam 12 includes a proximal end 14 and a distal end 16. The load beam 12 further includes a dimple, which as explained herein, permits the slider 2 to pitch and roll relative to the suspension 10. This movement of the slider 2 permits the slider 2 to follow the data track on a rotating magnetic disk(s) and accounts for vibrations or irregularities on the surface of the rotating magnetic disk(s).

The suspension 10 can also include a baseplate which is coupled to the load beam 12 adjacent to the proximal end 14. The baseplate can be coupled to the load beam 12 using a variety of mechanisms, such as, for example, welding or the like. Further, the baseplate is made from one or more metal materials, such as, for example, stainless steel. In an assembled HDD or a head stack assembly, the baseplate is coupled or "swaged" with an actuator arm.

Figure 2A:
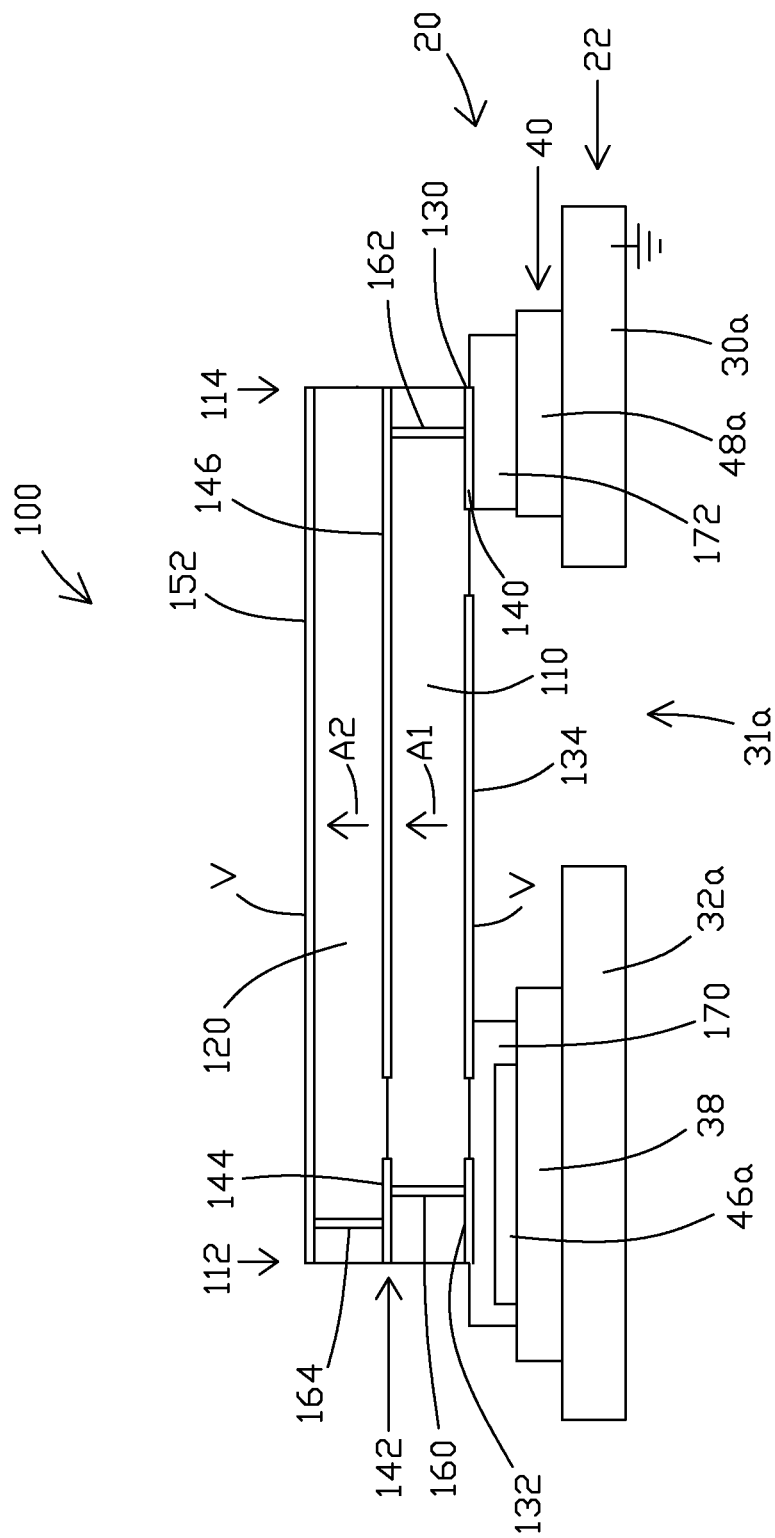
FIG. 2A is a cross-sectional view of a first microactuator of the suspension of FIG. 1.
Figure 2B:
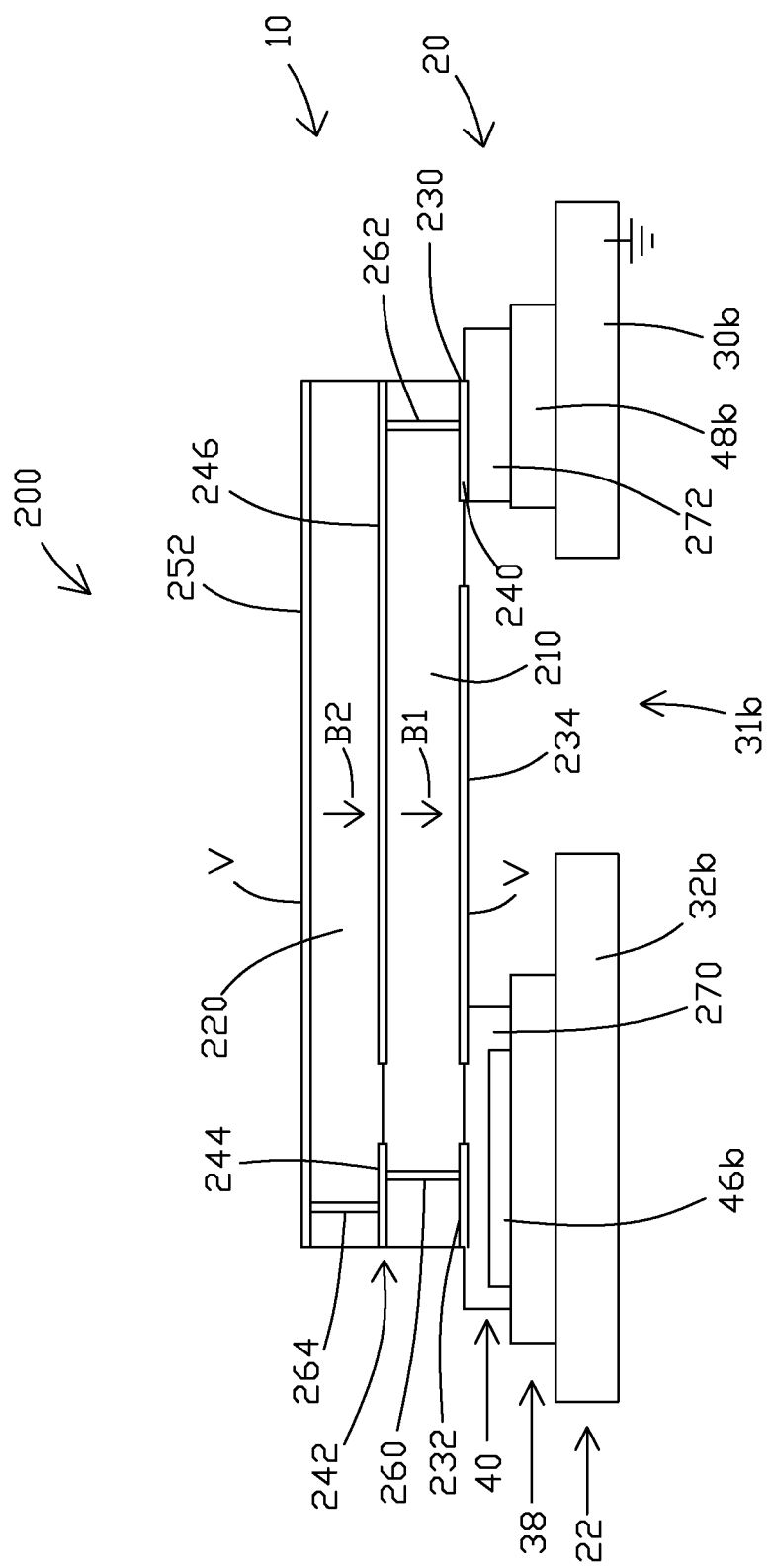
FIG. 2B is a cross-sectional view of a second microactuator of the suspension of FIG. 1.

As illustrated in FIGS. 1 and 2A-2B, the flexure 20 includes a spring metal layer 22, an insulating layer 38, and a conductive layer 40. The flexure 20 is generally used to electrically connect the slider 2 to other hard disk drive circuitry, such as, for example, a preamplifier circuit. The flexure 20 can be coupled to the load beam 12 using a variety of mechanisms, such as, for example, welding the spring metal layer 22 of the flexure 20 to the load beam 12.

The spring metal layer 22 includes a main body 24, a first support arm 26a, a second support arm 26b, a first linkage member 28a, a second linkage member 28b, and a slider mounting region 34. The spring metal layer 22 is made from one or more metal materials, such as, for example, stainless-steel.

As illustrated, the first and second support arms 26a, 26b extend from the main body 24 towards a distal end of the flexure that is adjacent to the distal end 16 of the load beam 12. The first linkage member 28a extends from the first support arm 26a inwardly towards a longitudinal axis of the flexure 20 such that the first linkage member 28a is positioned between the first support arm 26a and the second support arm 26b. Likewise, the second linkage member 28b extends from the second support arm 26b generally towards the longitudinal axis of the flexure 20 such that it is positioned between the second support arm 26b and the first support arm 26a. The slider mounting region 34 is coupled to the first linkage member 28a and the second linkage member 28b and is generally used to support the slider 2. The slider mounting region 34 includes a load point location that is sized and shaped to engage the dimple of the load beam 12. The engagement between the load point location and the dimple of the load beam 12 allows the slider mounting region 34 to move relative to the support arms 26a, 26b. Corresponding movement of the linkage members 28a, 28b can be used to control the movement of the slider mounting region 34, and thus corresponding movement of the slider 2.

The first linkage member 28a includes a first distal mounting region 30a and the main body 24 includes a first proximal mounting region 32a. As best illustrated in FIG. 2A, which illustrates a cross-sectional view of a first microactuator of the suspension of FIG. 1, the first distal mounting region 30a is spaced from the first proximal mounting region 32a, thereby defining a first actuator opening 31a in the spring metal layer 22. As explained herein, the first distal mounting region 30a and the first proximal mounting region 32a are used to support the first microactuator 100. Similarly, the second linkage member 28b includes a second distal mounting region 30b and the main body 24 includes a second proximal mounting region 32b. As best illustrated in FIG. 2B, which illustrates a cross-sectional view of a second microactuator of the suspension of FIG. 1, the second distal mounting region 30b is spaced from the second proximal mounting region 32b, thereby defining a second actuator opening 31*b* in the spring metal layer 22. As explained herein, the second distal mounting region 30*b* and the second proximal mounting region 32*b* are used to support the second microactuator 200. The spring metal layer 22 can further include portions (e.g., tabs) that extend from other structures (e.g., the slider mounting region 34 or the main body 24) to aid in supporting the first microactuator 100, the second microactuator 200, or both.

The insulating layer 38 is formed on at least a portion of the spring metal layer 22, and the conductive layer 40 (FIGS. 2A and 2B) is formed on a portion of the insulating layer 38 and includes a first group of traces 42*a* (FIG. 1) and a second group of traces 42*b* (FIG. 1). Generally, each trace in the first group of traces 42*a* and the second group of traces 42*b* carries a current (e.g., a signal) along a length of the flexure 20. A plurality of traces in the first group of traces 42*a* and the second group of traces 42*b* include a tail terminal and a slider bonding terminal. The tail terminal of each trace is positioned in a tail region of the flexure 20 and can be bonded to a preamplifier circuit (e.g., using ultrasonic bonding) or other HDD circuitry when the HGA 1 is assembled into an HDD. The slider bonding terminal of each trace is positioned in a gimbal region of the flexure 20 that is generally adjacent to the distal end 16 of the load beam 12 and can be bonded to terminals of the slider 2 (e.g., by soldering) when the slider 2 is coupled to the slider mounting region 34.

The first group of traces 42*a* includes five traces, including a first power trace 44*a*. The first power trace 44*a* terminates at a first terminal pad 46*a*. As best illustrated in FIG. 2A, the first terminal pad 46*a* is formed on the insulating layer 38 above the first proximal mounting region 32*a*. The other four traces in the first group of traces 42*a* can be used to carry read or write signals to and from the slider 2 or can be used as a grounding trace(s). Similarly, the second group of traces 42*b* includes five traces, including a second power trace 44*b*. The second power trace 44*b* terminates at a second terminal pad 46*b*. As best illustrated in FIG. 2B, the second terminal pad 46*b* is formed on the insulating layer 38 above the second proximal mounting region 32*b*. The other four traces in the second group of traces 42*b* can be used to carry read or write signals to and from the slider 2 or can be used as a grounding trace(s). As explained herein, the first power trace 44*a* and the second power trace 44*b* are generally used to supply power to the first microactuator 100 and the second microactuator 200, respectively.

The first group of traces 42*a* and the second group of traces 42*b* can be made from one or more conductive materials, such as, for example, copper or a copper alloy. While the first group of traces 42*a* and the second group of traces 42*b* are each shown as including five traces (including a power trace), each group of traces can include any appropriate number of traces (e.g., six traces, eighth traces, twenty traces, etc.), which can be used for any purpose (e.g., carrying read signals to and from the slider 2, carrying write signals to and from the slider 2, one or more ground traces, etc.). Further, the first group of traces 42*a* and the second group of traces 42*b* can include the same or different number of traces. The first group of traces 42*a* and the second group of traces 42*b* can be formed on the insulating layer 38 using a variety of methods, such as, for example, an additive process, a semi-additive process, or a subtractive process. An outer surface of the first group of traces 42*a* and/or the second group of traces 42*b* can include a plating layer (e.g., nickel, gold, or any combination thereof).

The conductive layer also includes a first ground pad 48*a* and a second ground pad 48*b*. As best illustrated in FIG. 2A, the first ground pad 48*a* is formed on the first distal mounting region 30*a* of the spring metal layer 22 of the flexure 20. Likewise, as best illustrated in FIG. 2B, the second ground pad 48*b* is formed on the second distal mounting region 30*b* of the spring metal layer 22 of the flexure 20. While the first ground pad 48*a* and the second ground pad 48*b* are shown as being in direct contact with the spring metal layer 22, an intermediate conductive layer can be positioned between the ground pads and the spring metal layer 22. The intermediate conductive layer can be, for example, one or more electrodeposited layers of conductive material (e.g., gold, nickel, chromium, copper, or the like, or any combination thereof).

The insulating layer 38 is a dielectric material (e.g., polyimide) that inhibits electrical conductivity between the spring metal layer 22 and the conductive layer 40 (e.g., to inhibit electrical shorting between the spring metal layer 22 and the first group of traces 42*a* and/or the second group of traces 42*b*). According to some embodiments, the flexure 20 includes a cover layer 8 that is formed on at least a portion of the first group of traces 42*a*, the second group of traces 42*b*, or both. Like the insulating layer 38, the cover layer is a dielectric material (e.g., polyimide) that aids in inhibiting electrical shorting of the first and second groups of traces 42*a*, 42*b* (e.g., through incidental physical contact with other components) and to protect the traces from damage during handling of the flexure 20 (e.g., during assembly of the suspension 10 or the HGA 1). The insulating layer 38 and cover layer can be the same or different dielectric materials.

As described above, when assembled into a HDD, the suspension 10 is moved by a voice coil motor to control movement of the slider 2 over a rotating magnetic disk. The first microactuator 100 and the second microactuator 200 are used to more precisely move the slider 2 to provide substantially finer control of the position of the slider 2 than the voice coil motor alone. Because both the voice coil motor and the microactuators 100, 200 are used to move the slider 2 relative to the suspension 10, such a suspension is commonly referred to as a dual-stage actuation ("DSA") suspension. Additionally, the suspension 10 can include one or more microactuators mounted to the base plate, and such a suspension is commonly referred to as a tri-stage actuation suspension.

As best illustrated in FIG. 2A, the first microactuator 100 includes a piezoelectric ("PZT") element layer 110, a constraining layer 120, a lower electrode layer 130, a middle electrode layer 142, and an upper electrode layer 152. When an actuation voltage is applied to the first microactuator 100, the PZT element layer 110 expands or contracts, changing the length of the first actuator opening 31*a* to cause corresponding movement of the first linkage member 28*a*, the slider mounting region 34, and the slider 2. The PZT element layer 110 can be made from, for example, lead zirconate titanate. The term "PZT" is often used as shorthand to refer generally to piezoelectric devices. That shorthand terminology is used herein, and it should be understood that a "PZT" device need not be strictly made of lead zirconate titanate.

As discussed herein, the first microactuator 100 is coupled to the suspension 10 (e.g., using conductive adhesive or any other appropriate adhesive). When the PZT element layer 110 expands, a bottom portion of the PZT element layer 110 that is directly adjacent to the suspension 10 does not expand as much as a top portion of the PZT element layer 110 that is further away from the suspension 10. This is because the bottom portion of the PZT element layer 110 is partially constrained due to the bonding of the first microactuator 100 to the suspension 10. Thus, the top portion of the PZT element layer 110 expands more than the bottom portion, causing the PZT element layer 110 to bend during expansion. This bending results in a loss of the overall expansion (often referred to as "stroke length") of the PZT element layer 110. Similarly, when the PZT element layer 110 contracts, the PZT element layer 110 bends as well.

The constraining layer 120 is used to reduce, inhibit, and/or control the bending of the first microactuator 100 caused by the bottom portion of the PZT element layer 110 being partially constrained. The constraining layer 120 is a generally rigid or stiff layer that partially inhibits expansion or contraction of the PZT element layer 110 and increases the stroke length of the microactuator. More specifically, the constraining layer 120 can be used to bend the microactuator 100 in the opposite direction as the bend caused by the expansion or contraction of the PZT element layer 110. The constraining layer 120 can also be used to reduce the likelihood of mechanical failure of the PZT element layer 110 caused by expansion/contraction or other stresses.

In some implementations, the constraining layer 120 is made from the same or similar material as the PZT element layer 110. This is often referred to as an active constraining layer construction ("CLC"). In such implementations, as explained herein, applying an actuation voltage across the first microactuator 100 causes opposing movement of both the PZT element layer 110 and the constraining layer 120. For example, if the actuation voltage causes the PZT element layer 110 to expand, the constraining layer 120 contracts. Similarly, if the actuation voltage causes the PZT element layer 110 to contract, the constraining layer 120 expands.

As illustrated, the lower electrode layer 130 is formed on a bottom surface of the PZT element layer 110 and includes a first lower electrode island 132, a second lower electrode island 134, and a third lower electrode island 140. The first lower electrode island 132 is positioned directly adjacent to a proximal end 112 of the first microactuator 100 and the third lower electrode island 140 is positioned directly adjacent to a distal end 114 of the first microactuator 100. Each of the first lower electrode island 132, the second lower electrode island 134, and the third lower electrode island 140 are spaced from one another such that each electrode island is electrically isolated from the others for the PZT poling process. The lower electrode layer 130 can be made from a conductive metal material, such as, for example, nickel, chromium, gold, copper, or any combination thereof. Further, the lower electrode layer 130 can be formed on the bottom surface of the PZT element layer 110 by various mechanisms, such as, for example, sputtering or other deposition processes.

The middle electrode layer 142 is positioned between the PZT element layer 110 and the constraining layer 120 and includes a first middle electrode island 144 and a second middle electrode island 146. The first middle electrode island 144 is similar to the first lower electrode island 132 described above in that it is positioned directly adjacent to the proximal end 112 of the first microactuator 100. As illustrated, the first middle electrode island 144 is generally coincident with the first lower electrode island 132, although the first middle electrode island 144 can be offset or spaced from the first lower electrode island 132. The second middle electrode island 146 is similar to the second lower electrode island 134 in that it is spaced from the first middle electrode island 144, however, the second middle electrode island 146 extends from the distal end 114 towards the proximal end 112 of the first microactuator 100. The middle electrode layer 142 can be made from the same or different materials than the lower electrode layer 130. Further, the middle electrode layer 142 can be formed on the top surface of the PZT element layer 110 or bottom surface of the constraining layer 120 using various mechanisms, such as, for example, sputtering or other deposition processes.

As illustrated, the upper electrode layer 152 is positioned on a top surface of the constraining layer 120. Unlike the lower electrode layer 130 and the middle electrode layer 142 which comprise a plurality of electrode islands that are spaced from each other, the upper electrode layer 152 extends from the distal end 114 of the PZT element layer 110 to the proximal end 112. The upper electrode layer 152 can be made from the same or different materials as the middle electrode layer 142 and/or the lower electrode layer 130. Further, the upper electrode layer 552 can be formed on the top surface of the constraining layer 120 using various mechanisms, such as, for example, sputtering or other deposition processes.

As illustrated in FIG. 2A, the flexure 20 includes a first volume of conductive adhesive 170 and a second volume of conductive adhesive 172, which are used to couple the first microactuator 100 to the flexure 20 of the suspension 10. The first volume of conductive adhesive 170 is positioned on the insulating layer 38 such that it covers at least a portion of the first terminal pad 46a of the first power trace 44a (FIG. 1). As illustrated, the first lower electrode island 132 and the second lower electrode island 134 of the lower electrode layer 130 are disposed within and/or contact the first volume of conductive adhesive 170. The first volume of conductive adhesive 170 and the second volume of conductive adhesive 172 mechanically couple the first microactuator 100 to the first distal mounting region 30a and the first proximal mounting region 32a of the spring metal layer 22 of the flexure 20. The first volume of conductive adhesive 170 electrically connects the first lower electrode island 132 to the first terminal pad 46a, and also electrically connects the second lower electrode island 134 to the first terminal pad 46a. As illustrated, the first volume of conductive adhesive 170 is sufficiently wide such that both the first lower electrode island 132 and the second lower electrode island 134 are both in contact with the first volume of conductive adhesive 170. The second volume of conductive adhesive 172 electrically connects the third lower electrode island 140 to the first ground pad 48a.

The first volume of conductive adhesive 170 and the second volume of conductive adhesive 172 can be, for example, an electrically conductive epoxy. The electrically conductive epoxy can include conductive filler particles that aid in permitting electrical conductivity through the volume of epoxy. The conductive filler particles can be, for example, silver particles, gold particles, nickel particles, chromium particles, or the like, or any combination thereof.

The PZT element layer 110 includes a first electrical via 160 and a second electrical via 162. The first electrical via 160 electrically connects the first lower electrode island 132 of the lower electrode layer 130 and the first middle electrode island 144 of the middle electrode layer 142. The first electrical via 160 includes a throughhole formed in the PZT element layer 110 and a column of conductive material disposed in the throughhole. The throughhole can also include a sputtered layer of metal (e.g., copper and/or chromium) formed on walls defined by the throughhole. The sputtered layer of metal can be used to aid in forming the column of conductive material in the throughhole in order to form the first electrical via 160. The column of conductive material is coupled to and/or contacts the first lower electrode island 132 and the first middle electrode island 144 to provide an electrical connection between the lower electrode layer 130 and the middle electrode layer 142. As described above, the first lower electrode island 132 is electrically connected to the first terminal pad 46a, thus, the first electrical via 160 electrically connects the first middle electrode island 144 and the first terminal pad 46a. While the cross-sectional view of FIG. 2A shows only the first electrical via 160 between the first lower electrode island 132 and the first middle electrode island 144, any appropriate number of electrical vias can be positioned between the two electrode islands (e.g., two electrical vias, three electrical vias, five electrical vias, etc.).

The second electrical via 162 is the same as or similar to the first electrical via 160 described above and electrically connects the third lower electrode island 140 and the second middle electrode island 146. As described above, the third lower electrode island 140 is electrically connected to the first ground pad 48a via the second volume of conductive adhesive 172, thus, the second electrical via 162 electrically connects the second middle electrode island 146 to the first terminal pad 46a. While the cross-sectional view of FIG. 2A shows the second electrical via 162 between the third lower electrode island 140 and the second middle electrode island 146, any number of electrical vias between the two electrode islands is possible (e.g., two electrical vias, three electrical vias, five electrical vias, etc.).

The third electrical via 164 is the same or similar to the first electrical via 160 and the second electrical via 162, and electrically connects the first middle electrode island 144 and the upper electrode layer 152. Like the first and second electrical vias 160, 162, the third electrical via 164 includes a throughhole in the constraining layer 120 and a column of conductive material. As described above, the first terminal pad 46a, the first volume of conductive adhesive 170, the first lower electrode island 132, the first electrical via 160, and the first middle electrode island 144 are electrically connected, thus, the third electrical via 164 electrically connects the upper electrode layer 152 to the first terminal pad 46a through the first microactuator 100.

The PZT element layer 110 is poled in the direction of arrow A1. Similarly, the constraining layer 120 is poled in the direction of arrow A2, which is generally the same direction as arrow A1. Poling refers to applying a DC voltage across the PZT element layer 110 and/or constraining layer 120 for a predetermined period of time to cause a permanent dipole arrangement. Generally, poling occurs only in areas of the PZT element layer 110 and constraining layer 120 across which a voltage differential is applied. The other areas that are not poled are often referred to as dead zone areas. Typically, these dead zone areas will be more frequent adjacent to the proximal end 112 and the distal end 114 of the microactuator 100. When an activation voltage is applied to the microactuator, the areas that are poled will cause the desired movement (e.g., expansion or contraction), while the dead zone areas will not. These dead zone areas are undesirable as they inhibit movement of the microactuator (e.g., leading to reduced stroke length).

As described above, the first power trace 44a delivers an electric current to the first terminal pad 46a. This current flows through the various components to the upper electrode layer 152, and also flows to the second lower electrode island 134. As illustrated, the upper electrode layer 152 has a voltage V and the second lower electrode island 134 also has a voltage V. On the other hand, the second middle electrode layer 146 is electrically grounded. This voltage differential with the second middle electrode layer 146 is the actuation voltage that causes movement of the PZT element layer 110 and/or the constraining layer 120. Because the actuation voltage is applied generally parallel to the poling directions shown by arrow A1 and arrow A2, normal strain occurs. More specifically, in the configuration shown, the PZT element layer 110 expands and the constraining layer 120 contracts.

Referring to FIG. 2B, the microactuator 200 is the same as or similar to the first microactuator 100 and includes a piezoelectric ("PZT") element layer 210, a constraining layer 220, a lower electrode layer 230, a middle electrode layer 242, and an upper electrode layer 252. When an actuation voltage is applied to the first microactuator 200, the PZT element layer 210 expands or contracts, changing the length of second actuator opening 31b to cause corresponding movement of the second linkage member 28b, the slider mounting region 34, and the slider 2.

The PZT element layer 210 and the constraining layer 220 are the same as or similar to the PZT element layer 110 and the constraining layer 120 described above. Likewise, the lower electrode layer 230 is the same or similar to the lower electrode layer 130 in that it includes a first lower electrode island 232, a second lower electrode island 234, and a third lower electrode island 240. The middle electrode layer 242 is the same or similar to the middle electrode layer 142 in that it includes a first middle electrode island 244 and a second middle electrode island 246.

As illustrated, the second microactuator 200 is coupled to the flexure 20 of the suspension 10 in the same or similar manner as the first microactuator 100. More specifically, a first volume of conductive adhesive 270 and a second volume conductive adhesive 272 are used to couple the second microactuator 200 to the flexure 20.

Like the PZT element layer 110, the PZT element layer 210 includes a first electrical via 260 and a second electrical via 262 that are the same as or similar to the first electrical via 160 and the second electrical via 162. The first electrical via 260 electrically connects the first lower electrode island 232 of the lower electrode layer 230 and the first middle electrode island 244 of the middle electrode layer 242. The second electrical via 262 electrically connects the second middle electrode layer 246 to the third lower electrode island 240. The constraining layer 220 includes a third electrical via 264 that is the same as or similar to the third electrical via 164, and electrically connects the first middle electrode island 244 and the third upper electrode layer 252.

The PZT element layer 210 differs from the PZT element layer 110 in that it is poled in the direction of arrow B1, which is generally the opposite direction of arrow A1. Likewise, the constraining layer 220 differs from the constraining layer 120 in that it is poled in the direction of arrow B2, which is generally the same direction as arrow B1.

The second power trace 44b (FIG. 1) delivers an electric current to the second terminal pad 46b. This current flows through the various components to the upper electrode layer 252, and also flows to the second lower electrode island 234. As illustrated, the upper electrode layer 252 has a voltage V and the second lower electrode island 234 also has a voltage V. On the other hand, the second middle electrode layer 246 is electrically grounded. This voltage differential is the actuation voltage that causes movement of the PZT element layer 210 and/or the constraining layer 220. Because the actuation voltage is applied generally parallel to the poling directions shown by arrow B1 and arrow B2, normal strain occurs. In this configuration, the PZT element layer 210 contracts and the constraining layer 220 expands.

As described above, corresponding movement of the first microactuator 100 and the second microactuator 200 cause movement of the first linkage member 28a and the second linkage member 28b, which causes movement of the slider mounting region 34. To move the slider 2 about the load point location and dimple of the load beam 12, the first microactuator 100 and the second microactuator 200 work in tandem to push/pull the slider 2. Because the PZT element layer 110 and the constraining layer 120 of the first microactuator 100 are poled in generally the opposite direction as the PZT element layer 210 and the constraining layer 220 of the second microactuator 200, and in this example, the first microactuator 100 generally expands while the second microactuator 200 generally contracts. This opposing movement causes rotation of the slider 2 relative to the suspension 10 to precisely position the slider 2 on a rotating magnetic disk. If the layers of both the first microactuator 100 and the second microactuator 200 were poled in the same direction, the first microactuator 100 and the second microactuator 200 would move in the same direction (e.g., both would generally expand), and would not cause the desired movement of the slider 2.

Figure 3:
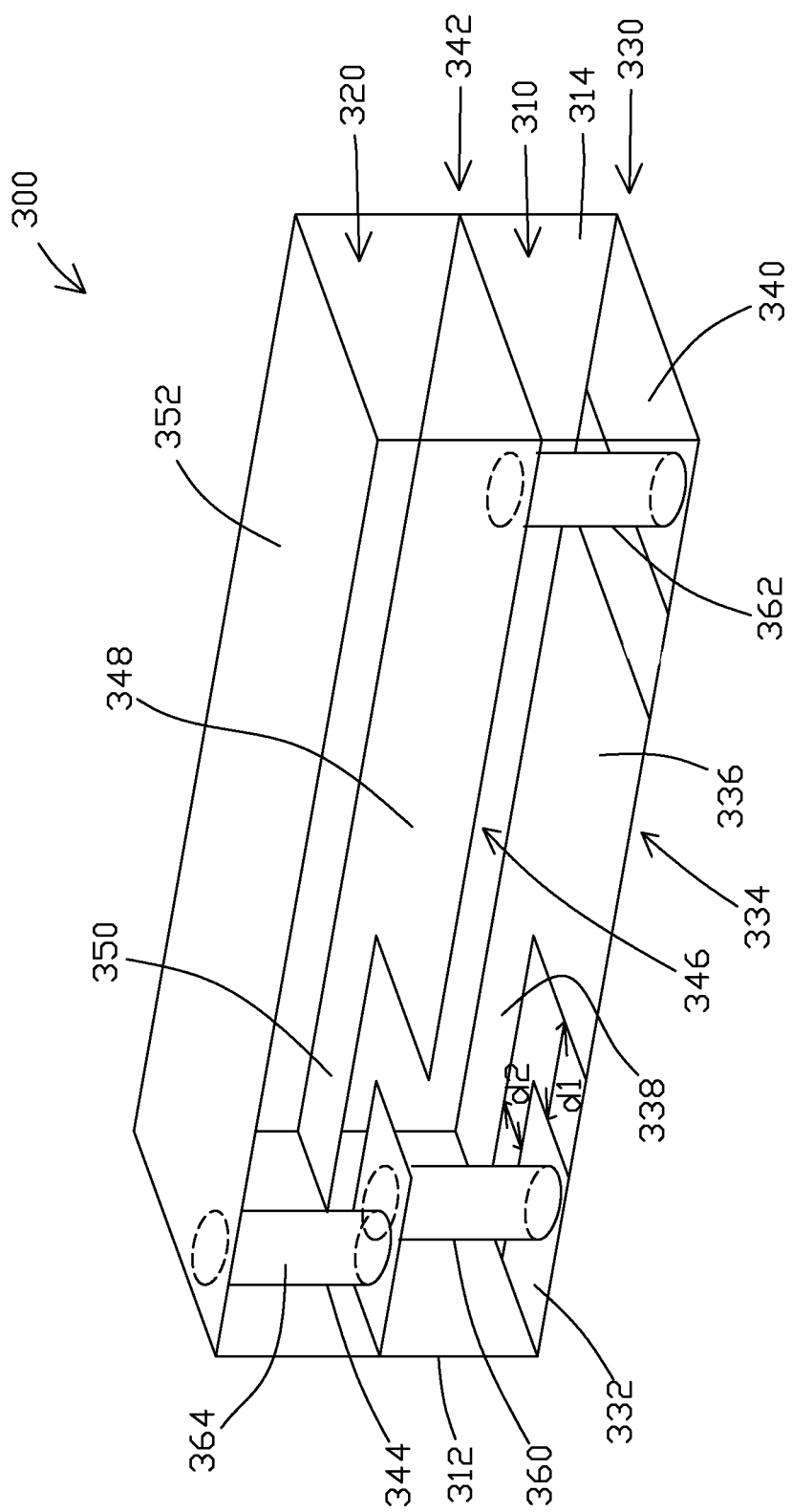
FIG. 3 is a partial cross-sectional view of a multi-layer microactuator assembly according to an embodiment.

FIG. 3 is a partial cross-sectional view of a multi-layer microactuator assembly according to an embodiment. As illustrated in FIG. 3, a first microactuator 300 includes a piezoelectric ("PZT") element layer 310, a constraining layer 320, a lower electrode layer 330, a middle electrode layer 342, and an upper electrode layer 352. The PZT element layer 310 includes a first electrical via 360 and a second electrical via 362. Likewise, the constraining layer 320 includes a third electrical via 364.

While the constraining 320 and the PZT element layer 310 are illustrated as being approximately the same thickness, the constraining layer 320 can be larger (e.g., thicker) than the PZT element layer 310 or smaller (e.g., thinner) than the PZT element layer 310. For example, the length of the constraining layer 320 can be shorter than the length of the PZT element layer 310, such that the microactuator has a step-like shape. The PZT element layer 310 and the constraining layer 320 can be made using various methods, such as, for example, coupling the constraining layer 320 to the PZT element layer 310 (e.g., using an adhesive), or by forming the constraining layer 320 on the PZT element layer 310 using an additive process. In some implementations, the constraining layer 320 can be a passive constraining layer construction made from, for example, stainless steel, unpoled (unactivated) piezoelectric material, a polymer (e.g., silicon), any other appropriate material, or any combination thereof.

The lower electrode layer 330 includes a first lower electrode island 332, a second lower electrode island 334, and a third lower electrode island 340. The second lower electrode island 334 includes a main body portion 336 and a finger 338. The finger 338 extends from the main body portion 336 towards a proximal end 312 of the PZT element layer 310. As illustrated, the main body portion 336 and the finger 338 both have a generally rectangular shape, although other shapes are possible. Together, the shape and sizes of the main body portion 336 and the finger 338 cause the second lower electrode island 334 to have a general "L" shape.

The finger 338 of the second lower electrode island 334 and the first lower electrode island 332 are spaced from one another such that the second lower electrode island 334 and the first lower electrode island 332 are electrically isolated from one another. Likewise, the main body portion 336 and the first lower electrode island 332 are spaced from one another. As shown, the finger 338 extends from the main body portion 336 all the way to the proximal end 312 of the PZT element layer 310. Alternatively, the finger 338 can extend from the main body portion 336 such that is spaced from the proximal end 312 of the PZT element layer 310, so long as there is some overlap between the finger 338 and the first lower electrode island 332.

The middle electrode layer 342 is similar to the middle electrode layer 142 in that it includes a first middle electrode island 344 and a second middle electrode island 346. However, unlike the second middle electrode island 146, the second middle electrode island 346 includes a main body portion 348 and a finger 350. The main body portion 348 extends from the distal end 314 of the PZT element layer 310 towards the proximal end 312. The finger 350 extends from the main body portion 348 to the proximal end 312. Both the main body portion 348 and the finger 350 are spaced from the first middle electrode island 344. As illustrated, the main body portion 348 and the finger 350 both have a generally rectangular shape, although other shapes are possible. Together, the shape and sizes of the main body portion 348 and the finger 350 cause the second middle electrode island 346 to have a general "L" shape.

Figure 4A:
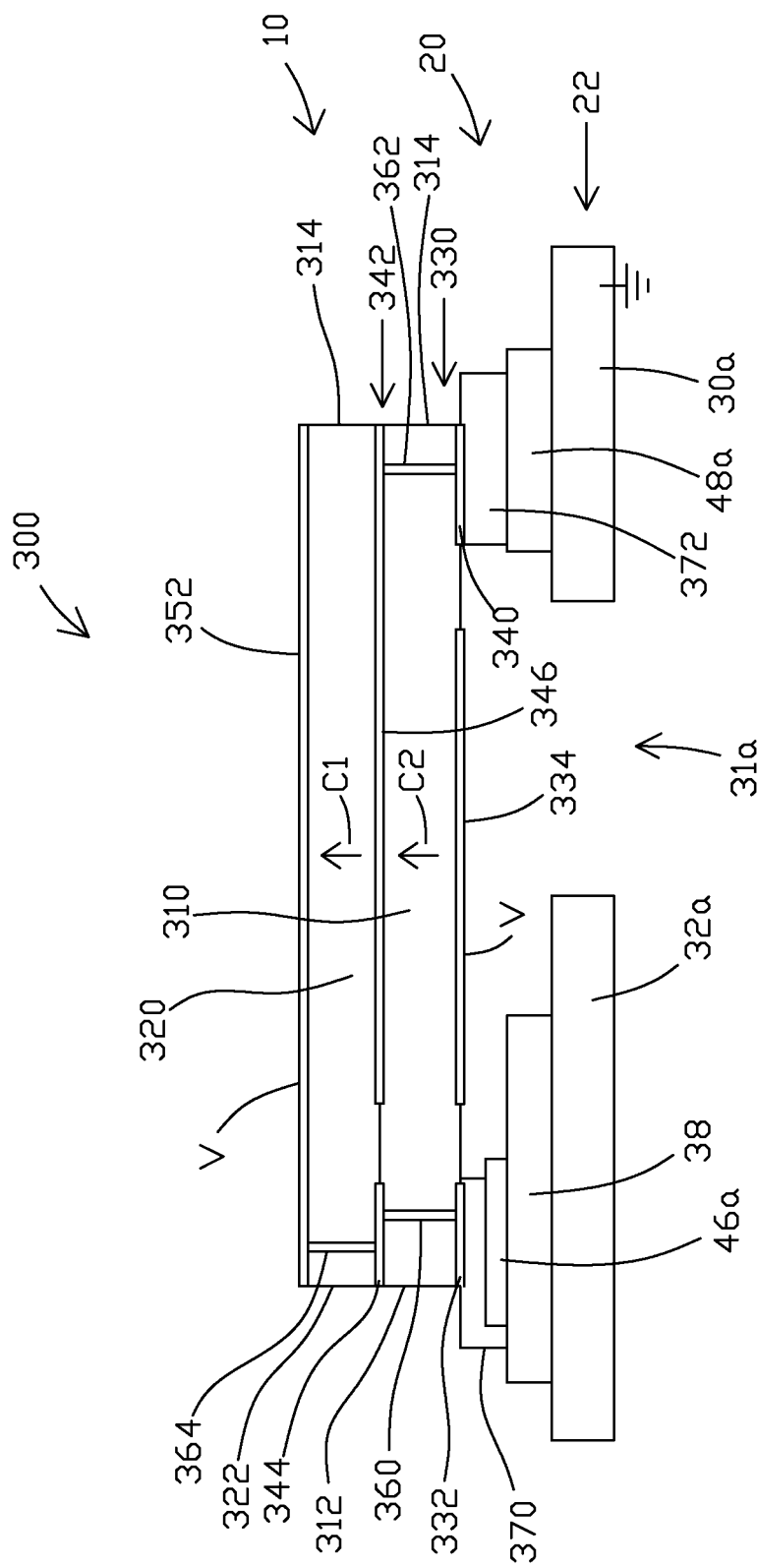
FIG. 4A is a cross-sectional view of the multi-layer microactuator assembly according to the embodiment illustrated in FIG. 3.

FIG. 4A is a cross-sectional view of the multi-layer microactuator assembly according to the embodiment illustrated in FIG. 3. As illustrated in FIG. 4A, the first microactuator 300 is coupled to the flexure 20 of the suspension 1. A first volume of conductive adhesive 370 mechanically couples the first microactuator 300 to the first proximal mounting region 32a of the spring metal layer 22 of the flexure 20. The first volume of conductive adhesive 370 also electrically connects the first terminal pad 46a to the first lower electrode island 332. Further, because the finger 338 of the second lower electrode island 334 extends to the proximal end 312 of the PZT element layer 310, the first volume of conductive adhesive 370 also electrically connects the second lower electrode island 334 to the first terminal pad 46a via the finger 338.

The first microactuator 300 can be coupled to the flexure 20 of the suspension 10 using a variety of methods. For example, in a first step, the first volume of conductive adhesive 370 is dispensed on at least a portion of the insulating layer 38 and/or the first terminal pad 46a and the second volume of conductive adhesive 372 is dispensed on at least a portion of the first ground pad 48a. In a second step, the first microactuator 300 is then moved towards the flexure 20 such that the first lower electrode island 332 contacts the first volume of conductive adhesive 370 and the third lower electrode island 340 contacts the second volume of conductive adhesive 372. As the first microactuator 300 moves towards the flexure 20, the first volume of conductive adhesive 370 and the second volume of conductive adhesive 372 "wick" or flow around the electrode islands. In a third step, the first volume of conductive adhesive 370 and the second volume of conductive adhesive 372 are then cured for a predetermined period of time (e.g., ten seconds, thirty seconds, one minute, five minutes, ten minutes, etc.) to couple the first microactuator 300 to the flexure 20.

Advantageously, in this arrangement, the first volume of conductive adhesive 370 can be substantially smaller in a lengthwise direction than the first volume of conductive adhesive 170 of the microactuator mounted on a suspension as illustrated in FIG. 2A because the first volume of conductive adhesive 370 does not need to span across the space between the first lower electrode island 332 and the second lower electrode island 334 to electrically connect both to the first terminal pad 46a. Thus, this arrangement reduces the required conductive adhesive material to manufacture the suspension 10.

Further, because the second lower electrode island 334 extends all the way to the proximal end 312 of the microactuator 300 (as opposed to the second lower electrode island 134), the finger 338 reduces dead zones in the PZT element layer 310. Because the finger 338 increases the effective length of the second lower electrode island 334, the finger 338 allows a voltage to be applied across a larger portion of the PZT element 310 and/or constraining layer 320, increasing the areas that can be poled and subsequently activated by the actuation voltage. Similarly, the finger 350 of the second middle electrode island 346 aids in reducing dead zone areas in the PZT element layer 110 and/or the constraining layer 320. Again, because the finger 350 extends the effective length of the second middle electrode island 346 to which a voltage may be applied, more areas of the PZT element layer 310 and/or the constraining layer 320 can be poled and subsequently activated responsive to the actuation voltage.

Figure 4B:
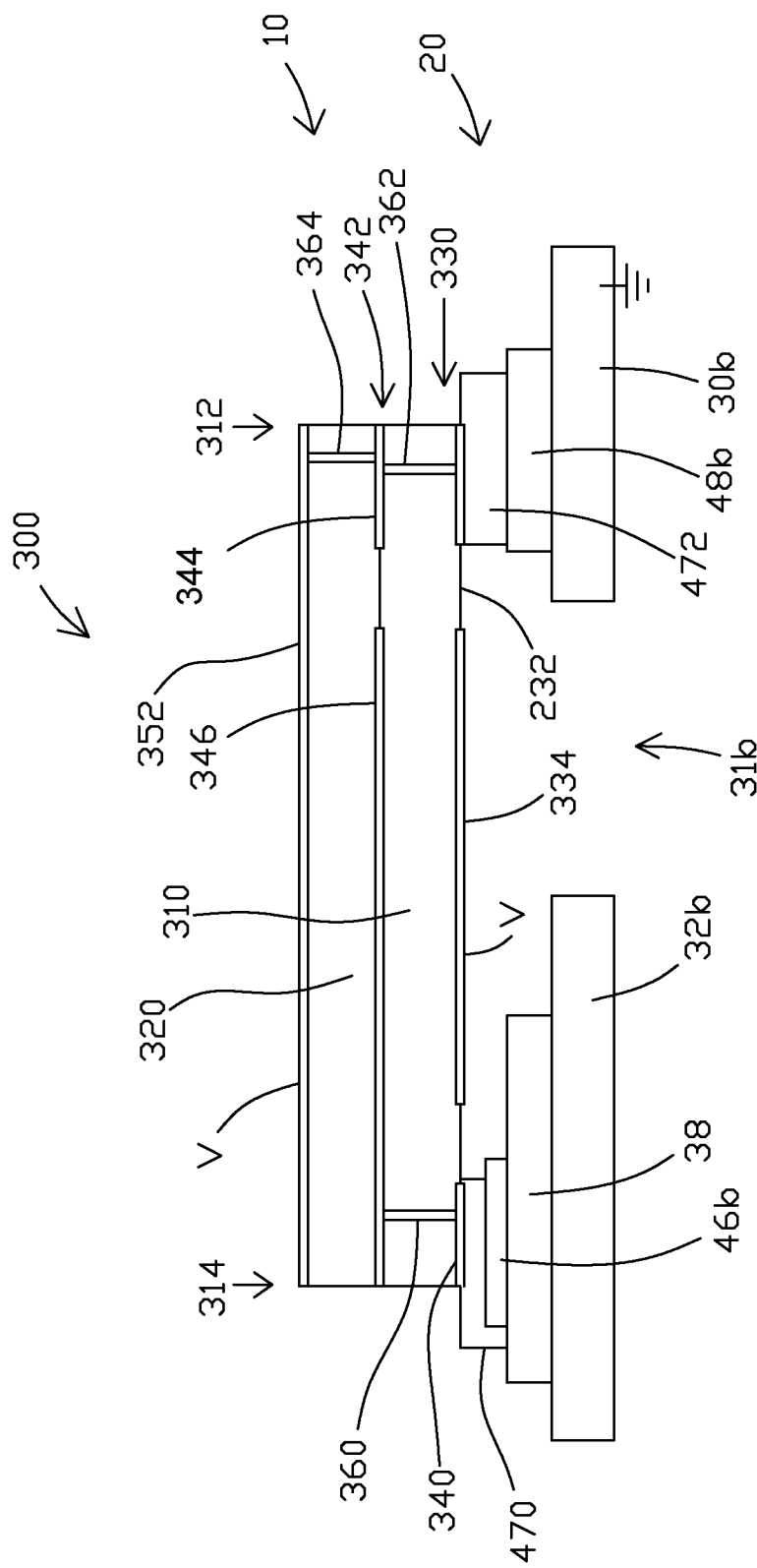
FIG. 4B is a cross-sectional view of a second multi-layer microactuator assembly according to the embodiment coupled to a suspension.

FIG. 4B is a cross-sectional view of a second multi-layer microactuator assembly according to the embodiment coupled to a suspension. As illustrated in FIG. 4B, the microactuator 300 can also be coupled to the second proximal mounting region 32b and the second distal mounting region 30b of the spring metal layer 22 of the flexure 20. As compared to the configuration shown in FIG. 4A, the microactuator 300 is rotated 180 degrees such that the distal end 314 is coupled to the second proximal mounting region 32b and the proximal end 312 is coupled to the second distal mounting region 30b.

As illustrated, a first volume of conductive adhesive 470 that is the same as or similar to the first volume of conductive adhesive 370 described above is positioned between the third lower electrode island 340 and the second terminal pad 46b. The first volume of conductive adhesive 470 mechanically couples the distal end 314 of the microactuator 300 to the second proximal mounting region 32b and electrically connects the second terminal pad 46b and the third lower electrode island 340. Similarly, a second volume of conductive adhesive 472 is positioned between the second ground pad 48b and the first lower electrode island 332. The second volume of conductive adhesive 472 mechanically couples the proximal end 312 of the microactuator 300 to the second distal mounting region 30b and electrically connects the second ground pad 48b and the first lower electrode island 332.

As described above and illustrated in FIG. 3, the second lower electrode island 334 includes the finger 338 and the second middle electrode island 346 includes the finger 350. Unlike the configuration shown in FIG. 4A, the finger 338 extends from the main body portion 348 of the second middle electrode island 346 such that it is in contact with the second volume of conductive adhesive 472. Thus, the second middle electrode island 346 is electrically connected to the second ground pad 48b.

As illustrated in FIGS. 4A and 4B, the PZT element layer 310 is poled in the direction of arrow C1 and the constraining layer 320 is poled in the direction of arrow C2. In other words, the PZT element layer 310 and the constraining layer 320 are both poled in the same direction regardless of whether the microactuator 300 is coupled to the first distal mounting region 30a and the first proximal mounting region 32a (FIG. 4A), or the second distal mounting region 30b and the second proximal mounting region 32b (FIG. 4B). As illustrated in FIG. 4A, when an actuation voltage is applied to the microactuator 300, there is a voltage V on the upper electrode layer 352 and there is a voltage V on the second lower electrode island 334 of the lower electrode layer 330. On the other hand, the second middle electrode 346 is electrically grounded. As a result of this voltage differential shown in FIG. 4A, the PZT element layer 310 expands and the constraining layer 320 contracts. As for the microactuator configuration shown in FIG. 4B, when an actuation voltage is applied to the microactuator 300, there is a voltage V on the middle electrode layer 346 while the upper electrode layer 352 and the second lower electrode 334 are electrically grounded.

Thus, advantageously, two microactuators that are the same as the microactuator 300 can be coupled to the flexure 20 of the suspension 10 to produce the opposing or push/pull movement of the slider 2 described above. Rather than having to pole the microactuators in different directions to achieve the push/pull or opposing movement, the two microactuators are simply rotated 180 degrees relative to one another on the flexure 20 (FIGS. 4A and 4B), simplifying the manufacturing process. In other words, the microactuator 300 is reversibly mountable on the suspension 10. In contrast, because the first microactuator 100 illustrated in FIG. 2A and the second microactuator 200 illustrated in FIG. 2B do not include a finger, the first microactuator 100 cannot be rotated 180 degrees and mounted to the second distal mounting region 30b and the second proximal mounting region 32b. Likewise, the second microactuator 200 cannot be rotated 180 degrees and mounted to the first distal mounting region 30a and the first proximal mounting region 32a.

Figure 5:
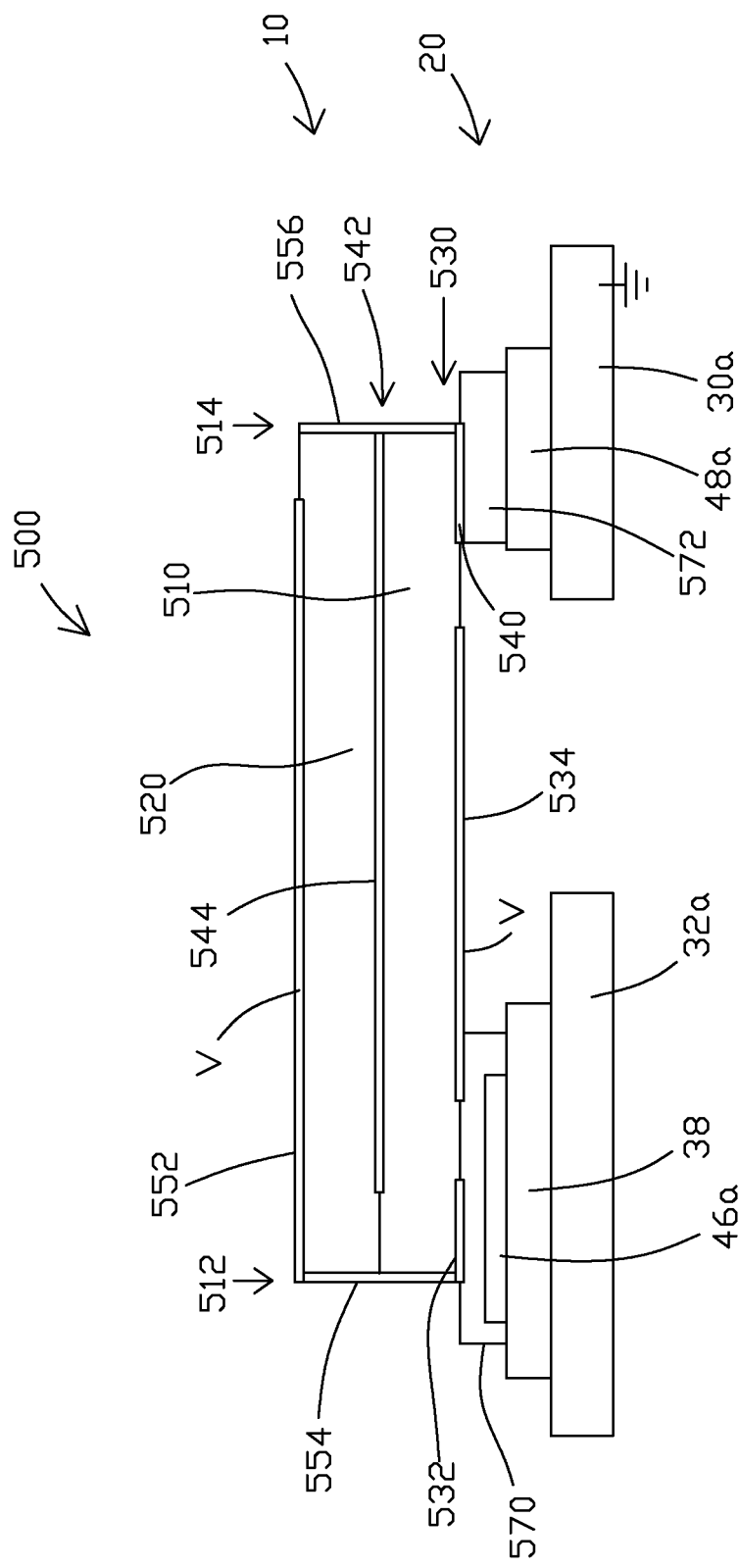
FIG. 5 is a cross-sectional view of a microactuator, according to an embodiment, coupled to the suspension of FIG. 1.

FIG. 5 is a cross-sectional view of a microactuator according to an embodiment coupled to the suspension of FIG. 1. As illustrated in FIG. 5, a microactuator 500 is coupled to the flexure 20 of the suspension 10 (FIG. 1). The microactuator 500 includes a piezoelectric ("PZT") layer 510, a constraining layer 520, a lower electrode layer 530, a middle electrode layer 542, and an upper electrode layer 552. The microactuator 500 includes a middle electrode layer 542 configured as a single electrode island.

Further, the microactuator 500 does not include electrical vias. Instead, the microactuator 500 includes a first side end electrode 554 and a second side end electrode 556. The first side end electrode 554 is coupled to a proximal end 512 of the microactuator 500, and more specifically, is coupled to the first lower electrode island 532 and the upper electrode layer 552. The first side end electrode 554 electrically connects the first lower electrode island 532 and the upper electrode layer 552. As illustrated, the middle electrode layer 542 is spaced from the first side end electrode 554 such that the middle electrode layer 542 is electrically isolated from the first side end electrode 554.

The second side end electrode 556 is coupled to a distal end 514 of the microactuator 500, and more specifically, is coupled to the third lower electrode island 540 and the middle electrode layer 542. The second side end electrode 556 electrically connects the third lower electrode island 542 and the middle electrode layer 542. As illustrated, the upper electrode layer 552 is spaced from the second side end electrode 556 such that the upper electrode layer 552 is electrically isolated from the second side end electrode 556.

The microactuator 500 is coupled to the flexure 20 of the suspension 10. A first volume of electrically conductive adhesive 570 couples the proximal end 512 of the microactuator 500 to the first proximal mounting region 32a. The first volume of electrically conductive adhesive 570 is dispensed on at least a portion of the first terminal pad 46a.

As illustrated, the first lower electrode island 532 and the second lower electrode island 534 are spaced from one another such that at least a portion of both the first lower electrode island 532 and the second lower electrode island 532 are in contact with the first volume of electrically conductive adhesive 570. Thus, the upper electrode layer 552 is electrically connected to the first terminal pad 46*a* via the first volume of electrically conductive adhesive 570, the first lower electrode island 532, and the first side end electrode 554. Similarly, a second volume of electrically conductive adhesive 572 is dispensed on at least a portion of the first ground pad 48*a*, coupling the distal end 514 of the microactuator 500 to the first distal mounting region 30*a*. At least a portion of the third lower electrode island 540 is in contact with the second volume of conductive adhesive 572 such that the middle electrode layer 542 is electrically connected to the first ground pad 48*a* via the second side end electrode 556.

Figure 6:
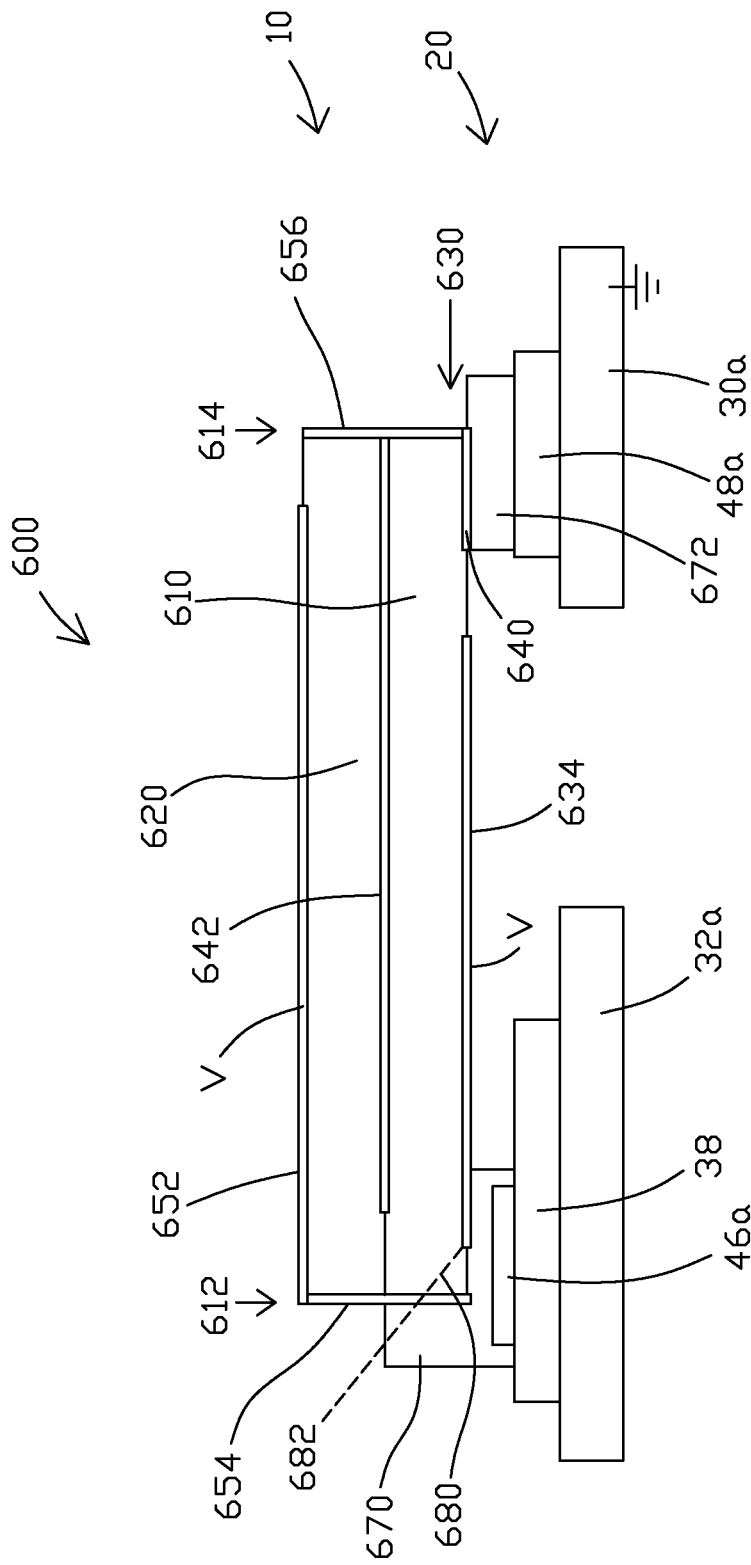
FIG. 6 is a cross-sectional view of a multi-layer microactuator assembly according to an embodiment coupled to the suspension of FIG. 1.

FIG. 6 is a cross-sectional view of a multi-layer microactuator assembly according to an embodiment coupled to the suspension of FIG. 1. As illustrated in FIG. 6, a microactuator 600 is coupled to the flexure 20 of the suspension 1. The microactuator 600 includes a piezoelectric ("PZT") element layer 610, a constraining layer 620, a lower electrode layer 630, a middle electrode layer 642, an upper electrode layer 652, a first side end electrode 654, and a second side end electrode 656. The lower electrode layer 630 includes a second lower electrode island 634 and a third lower electrode island 640. The second lower electrode island 634 is spaced from the first side end electrode 654 and the third lower electrode island 640. The second lower electrode island 634 extends towards the proximal end 612 of the microactuator 600 and the first side end electrode 654.

The microactuator 600 is coupled to the flexure 20 of the suspension 10. A first volume of conductive adhesive 670 mechanically couples the proximal end 612 of the microactuator 600 to the first proximal mounting region 32*a*. Advantageously, by extending the second lower electrode island 634 towards the first side end electrode 654 as illustrated in FIG. 6, the first volume of conductive adhesive 670 can be smaller in a lengthwise direction because it contacts the second lower electrode island 634 rather than two separate islands. This arrangement also permits a smaller first terminal pad 46*a*, saving on conductive material (e.g., copper) and freeing more space on the flexure 20 for other components or features (e.g., more conductive traces).

Further, extending the second lower electrode island 634 further towards the first side end electrode 654 aids in reducing dead zone areas of the PZT element layer 610, the constraining layer 620, or both. As shown, a voltage (e.g., V) can be applied to the second lower electrode island 634 which acts on a larger portion of the PZT element layer 610 and/or constraining layer 620 (e.g., compared to the second lower electrode island 534). This arrangement allows more of the PZT element layer 610 and/or constraining layer 620 to be poled, which reduces dead zones when an activation voltage is applied, and improves the overall performance of the microactuator 600.

The first volume of conductive adhesive 670 extends along a height of the first side end electrode 654 towards the upper electrode layer 652. Thus, the first volume of conductive adhesive 670 electrically connects the first side end electrode 654 to the first terminal pad 46*a* without requiring an intermediate electrode island (e.g., the first lower electrode island 532) in the lower electrode layer 630. A portion of the first volume of conductive adhesive 670 can extend upwards towards the upper electrode layer 652 along the height of the first side end electrode 654 such that the first volume of conductive adhesive 670 extends along about 20% to about 80% of the height of the first side end electrode 654, about 40% to about 60% of the height of the first side end electrode 654, or about 50% of the height of the first side end electrode 654.

According to some embodiments, the microactuator 600 includes a bevel cut 680 to aid in maintaining electrical isolation between the second lower electrode island 634 and the first side end electrode 654. For example, the bevel cut 680 can be taken along line 682 such that the bevel cut 680 extends through a portion of the first side end electrode 654 and a portion of the PZT element layer 610. The bevel cut 680 removes a lower portion of the first side end electrode 654 such that the first side end electrode 654 is further spaced from the second lower electrode island 634 to aid in maintaining electrical isolation between the two. The bevel cut 680 can be made at a variety of angles, such as, for example, between about 15 degrees and about 75 degrees, between about 30 degrees and about 60 degrees, and about 45 degrees.

While the microactuators are illustrated herein and described herein as including a single PZT element layer and a single constraining layer, each microactuator can include any number of PZT element layers and/or constraining layers (e.g., two PZT element layers and two constraining layers, two PZT element layers and one constraining layer, three PZT element layers and three constraining layers, four PZT element layers and three constraining layers, etc.).

Further, while the microactuators as illustrated in FIG. 1 are coupled to the suspension 10 such that a longitudinal axis of each microactuator is generally parallel with a longitudinal axis of the flexure 20, the microactuators, such as those described herein, can be angled relative to the longitudinal axis of the flexure 20. Angling the microactuators relative to the longitudinal axis of the flexure 20 can be used to bring the center of rotation for the slider 2 closer to the dimple. For example, the longitudinal axis of the microactuators described herein may be angled by about 45 degrees relative to the longitudinal axis of the flexure 20, although other angles are possible (e.g., between about 30 degrees and about 60 degrees).

While the HGA 1 as illustrated in FIG. 1 and described herein as including the suspension 10, in some implementations, the HGA 1 includes a tri-stage actuation suspension. The tri-stage actuation suspension is similar to the suspension 10 in that it includes a load beam, a baseplate, and a flexure. The tri-stage actuation suspension differs from the suspension 10 in that it includes one or more baseplate motors. The one or more baseplate motors can be similar to the microactuators described herein, but differ in that the one or more baseplate motors are coupled to the baseplate rather than the flexure. For example, in such implementations, the baseplate can include mounting regions that are similar to the first distal mounting region 30*a* and the first proximal mounting region 32*a* described above for receiving a baseplate motor. The one or more baseplate motors can be configured to move the load beam. To provide power to and/or to control the one or more baseplate motors, the baseplate can include one or more groups of traces including terminal pads and ground pads. Each of the one or more baseplate motors can be coupled to the baseplate using the same or similar mechanisms and methods described above. In such implementations, the baseplate can also include a pseudo feature formed from a metal material (e.g., stainless steel). The pseudo feature is configured to balance out the mass distribution and stiffness of the baseplate. The pseudo feature can be coupled to the base plate using various mechanisms, such as, for example, welding, adhesive, or the like, or any combination thereof. Alternatively, the pseudo feature and the baseplate can be unitary and/or monolithic.

While the disclosure is susceptible to various modifications and alternative forms, specific embodiments and methods thereof have been shown by way of example in the drawings and are described in detail herein. It should be understood, however, that it is not intended to limit the disclosure to the particular forms or methods disclosed, but, to the contrary, the intention is to cover all modifications, equivalents and alternatives falling within the spirit and scope of the disclosure.

What is claimed is:

1. A multi-layer microactuation assembly for a hard disk drive assembly, comprising:
   a piezoelectric ("PZT") layer;
   a constraining layer;
   a lower electrode layer on a bottom surface of the PZT layer, the lower electrode layer including:
      a first lower electrode island; and
      a second lower electrode island including a main body portion and a finger, the finger extending from the main body portion towards a first end of the multi-layer microactuation assembly;
   a middle electrode layer disposed between a top surface of the PZT layer and a bottom surface of the constraining layer;
   an upper electrode layer on a top surface of the constraining layer;
   a first side end electrode coupled to the upper electrode and extending in a direction substantially orthogonal to the upper electrode towards the lower electrode layer; and
   a second side end electrode coupled to the first lower electrode island and extending in a direction substantially orthogonal to the first lower electrode island towards the upper electrode layer, the second side end electrode is configured to electrically connect the first lower electrode island and the middle electrode layer.

2. The multi-layer microactuator of claim 1, wherein the finger of the second lower electrode island aid in reducings dead zone areas of the first PZT layer, the constraining layer, or both.

3. The multi-layer microactuator of claim 2, wherein responsive to an actuation voltage being applied across the multi-layer microactuator, the PZT layer is configured to expand and the constraining layer is configured to contract.

4. The multi-layer microactuator of claim 1, wherein the constraining layer is an active constraining layer construction.

5. The multi-layer microactuator of claim 1, wherein responsive to an actuation voltage being applied across the multi-layer microactuator, the PZT layer is configured to contract and the constraining layer is configured to expand.

6. The multi-layer microactuator of claim 1, wherein the PZT element layer includes a bevel that aids in maintaining electrical isolation between the first side end electrode and the second lower electrode island of the lower electrode layer.

7. A suspension for a hard disk drive comprising:
   a load beam including a dimple;
   a flexure coupled to the load beam and including a spring metal layer, an insulating layer, and a conductive layer, the spring metal layer including a slider mounting region, a first mounting region, and a second mounting region, the slider mounting region having a load point location for engaging the dimple of the load beam, the conductive layer including a power trace and a ground pad, the motor power trace including a terminal pad;
   a first microactuator including:
      a piezoelectric ("PZT") layer;
      a constraining layer;
      a lower electrode layer on a bottom surface of the PZT layer, the lower electrode layer including:
         a first lower electrode island that is electrically connected to the ground pad; and
         a second lower electrode island that is electrically connected to the terminal pad;
      a middle electrode layer disposed between a top surface of the PZT layer and a bottom surface of the constraining layer;
      an upper electrode layer on a top surface of the constraining layer;
      a first side end electrode coupled to the upper electrode and extending in a direction substantially orthogonal to the upper electrode towards the lower electrode layer, the first side end electrode is electrically connected to the terminal pad via a first volume conductive adhesive; and
      a second side end electrode coupled to the first lower electrode island and extending in a direction substantially orthogonal to the first lower electrode island towards the upper electrode layer.

8. The suspension of claim 7, wherein the PZT element layer of the first microactuator includes a bevel that aids in maintaining electrical isolation between the first side end electrode and the second lower electrode island of the lower electrode layer.

9. The suspension of claim 7, wherein the first volume conductive adhesive aids in mechanically coupling a first end of the first microactuator to the first mounting region.

10. The suspension of claim 7, wherein the further comprising a second volume of electrically conductive adhesive positioned between the first lower electrode island and the ground pad to aid in (i) mechanically coupling a second end of the first microactuator to the second mounting region, and (ii) electrically connecting the first lower electrode island and the ground pad, and the second side end electrode and the ground pad.

11. The suspension of claim 7, wherein the PZT element layer is configured to expand responsive to an actuation voltage and the constraining layer is configured to contract responsive to the actuation voltage.

12. The suspension of claim 7, further comprising a second microactuator including:
   a piezoelectric ("PZT") layer;
   a constraining layer;
   a lower electrode layer on a bottom surface of the PZT layer, the lower electrode layer including:
      a first lower electrode island that is electrically connected to a second terminal pad of a second power trace of the conductive layer of the flexure; and
      a second lower electrode island that is electrically connected to a second ground pad of the conductive layer of the flexure;
   a middle electrode layer disposed between a top surface of the PZT layer and a bottom surface of the constraining layer;
   an upper electrode layer on a top surface of the constraining layer;

a first side end electrode coupled to the upper electrode and extending in a direction substantially orthogonal to the upper electrode towards the lower electrode layer; and a second side end electrode coupled to the first lower electrode island and extending in a direction substantially orthogonal to the first lower electrode island towards the upper electrode layer, the second side end electrode is configured to electrically connect the first lower electrode island and the middle electrode layer.

13. The suspension of claim 12, wherein responsive to an actuation voltage (i) the PZT element layer of the first microactuator and the constraining layer of the second microactuator are configured to expand, and (ii) the PZT element layer of the second microactuator and the constraining layer of the first microactuator are configured to contract.

14. The suspension of claim 13, wherein the PZT element layer of the first microactuator, the constraining layer of the first microactuator, the PZT element layer of the second microactuator, and the constraining layer of the second microactuator are poled in substantially the same direction.

15. The suspension of claim 7, wherein the PZT element layer is configured to contract responsive to an actuation voltage and the constraining layer is configured to expand responsive to the actuation voltage.

* * * * *